United States Patent [19]

Owaki

[11] Patent Number: 5,101,508
[45] Date of Patent: Mar. 31, 1992

[54] RADIO RECEIVER
[75] Inventor: Masanao Owaki, Kanagawa, Japan
[73] Assignee: Sony Corporation, Tokyo, Japan
[21] Appl. No.: 711,112
[22] Filed: Jun. 4, 1991

Related U.S. Application Data

[63] Continuation of Ser. No. 439,586, Nov. 21, 1989, abandoned.

[30] Foreign Application Priority Data

Nov. 24, 1988 [JP] Japan .................. 63-296607

[51] Int. Cl.⁵ .......................................... H04B 17/00
[52] U.S. Cl. .................................. 455/158; 455/181; 455/186
[58] Field of Search ............... 455/158, 179, 181, 183, 455/185, 186, 161, 165

[56] References Cited

U.S. PATENT DOCUMENTS

| | | | |
|---|---|---|---|
| 3,882,400 | 5/1975 | Hamada | 458/184 |
| 4,228,543 | 10/1980 | Jackson | 45/181 |
| 4,310,924 | 1/1982 | Miyasaka et al. | 455/181 |
| 4,403,344 | 9/1983 | Yamada et al. | 455/181 |
| 4,626,909 | 12/1986 | Ohiki et al. | 455/181 |
| 4,905,212 | 2/1990 | Wakahara | 485/181 |
| 4,914,517 | 2/1990 | Duffield | 455/186 |

FOREIGN PATENT DOCUMENTS 2,843,215 4/1980 Fed. Rep. of Germany.
3,504,066 8/1985 Fed. Rep. of Germany.
131865 5/1983 Japan .................. 455/181
46130 12/1985 Japan .................. 455/181

OTHER PUBLICATIONS

Application 56-8790 published in the Patent Abstracts of Japan, Vol. 5, No. 159, Oct. 14, 1981.

Primary Examiner—Reinhard J. Eisenzopf
Assistant Examiner—Lisa Charouel
Attorney, Agent, or Firm—Lewis H. Eslinger; Jay H. Maioli

[57] ABSTRACT

A radio receiver receives a radio broadcast by performing a frequency conversion on the basis of an oscillation signal from a phase locked loop. Specifically, a memory has a data table including broadcasting station data, broadcasting time data, and frequency data necessary for receiving a particular radio broadcast at the broadcasting time. A timer and a key are provided for selecting a broadcasting station. When the key is operated, a key output and time data indicated by the timer are supplied to the data table as input data to indicate the broadcasting station on the data table. The corresponding frequency data is thereupon read out of the data table. The frequency data thus read out is supplied to the phase locked loop, whereby a frequency indicated by the frequency data is selected as the frequency for reception.

9 Claims, 9 Drawing Sheets

| N | 411 | 412 | ------------- | 6089 |
|---|---|---|---|---|
| fo (kHz) | 2055 | 2060 | ------------- | 30445 |
| fr (kHz) | 1605 | 1610 | ------------- | 29995 |

| Group | Station Name BRDC | Starting Time BGNT | Ending Time ENDT | Frequency fr [kHz] | Frequency-dividing Ratio N |
|---|---|---|---|---|---|
| 1 | BBC | 0645 | 0715 | 7180 | 1526 |
|   | BBC | 0645 | 0715 | 9580 | 2006 |
|   | BBC | 2000 | 2030 | 11955 | 2481 |
|   | BBC | 2000 | 2030 | 15360 | 3162 |
| 2 | VOA | 0700 | 0900 | 15185 | 3127 |
|   | VOA | 0700 | 0900 | 15290 | 3148 |
|   | VOA | 0900 | 1300 | 15185 | 3127 |
|   | VOA | 0900 | 1300 | 15290 | 3148 |
|   | VOA | 2000 | 2400 | 15160 | 3122 |
|   | VOA | 2000 | 2400 | 15425 | 3175 |
| ⋮ | ⋮ | | | | |
| n | ..... | ..... | ..... | ..... | ..... |
|   | ⋮ | | | | |
|   | ..... | ..... | ..... | ..... | ..... |

DTBL

FIG. 6A

```
B  B  C
20:00 - 20:30
11955 kHz
Now Receiving
20:15   JST
```

FIG. 6D

```
V  O  A
20:00 - 24:00
15160 kHz
Now Receiving
20:15   JST
```

FIG. 6B

```
B  B  C
20:00 - 20:30
15360 kHz
Now Receiving
20:15   JST
```

FIG. 6C

```
B  B  C
06:45 - 07:15
7180 kHz
Standby mode
20:15   JST
```

RADIO RECEIVER

This is a continuation of application Ser. No. 07/439,586 filed Nov. 21, 1989 now abandoned.

BACKGROUND OF THE INVENTION

1. Field of the invention

The present invention relates generally to radio receivers and, more particularly, to a radio receiver by which a listener can readily select a target broadcasting station without knowing the frequency of the broadcasting station or its broadcasting time.

2. Description of the Prior Art

Figure 1:
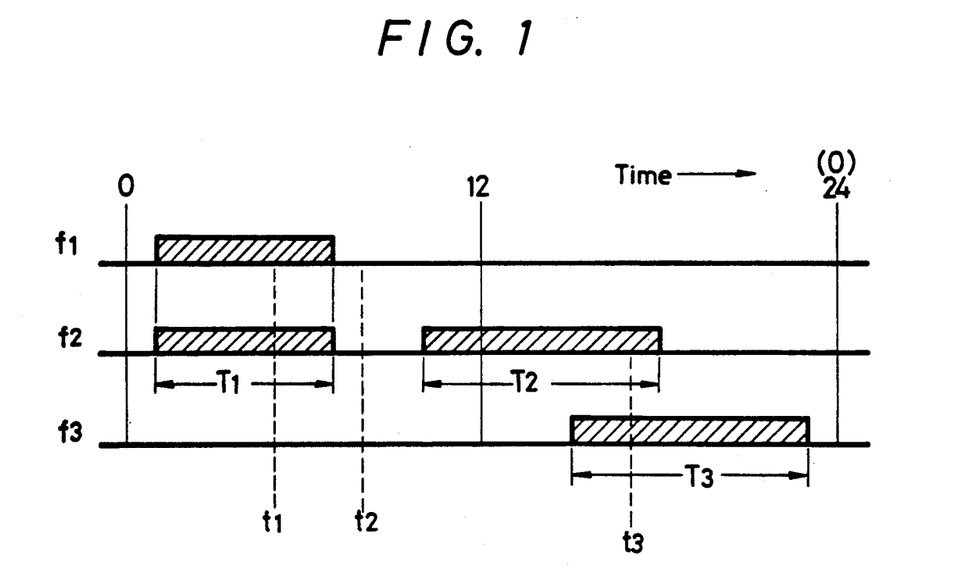
FIG. 1 is a schematic diagram of a radio broadcasting schedule, to which reference will be made in explaining how to select and listen to a desired radio broadcast.

Overseas broadcasts are generally performed by use of a shortwave band. In some broadcasting stations, the broadcasting schedule is determined as shown, for example, in FIG. 1. In FIG. 1, hatched portions represent time periods in which the broadcasts are performed. In this example, during the time period T1, two broadcast waves of frequencies f1 and f2 are employed to broadcast the same radio program (the same content); during the time period T2, the broadcast wave of frequency f2 is employed to broadcast the next radio program; and during the time period T3, the broadcast wave of frequency f3 is employed to broadcast a different radio program. Accordingly, when a user wants to listen to the radio program transmitted during the time period T1, the user can select one optimum frequency of the frequencies f1 and f2 and can listen to the selected radio program. Further, during the time periods T2 and T3, the listener can selectively listen to a desired one of the radio programs because different radio programs are broadcast using the broadcast waves of frequencies f2 and f3 during the time periods T2 and T3.

According to the above-mentioned radio broadcasting system in which a certain broadcasting station performs radio broadcasts in different time periods by utilizing a plurality of frequencies, dedicated listeners or those with some expertise in the use of shortwave radio can enjoy the benefits of such radio broadcasting system because they remember the broadcast frequencies and broadcast times on the basis of their experience. It is, however, frequently observed that beginners or ordinary listeners are perplexed by the operation of shortwave radio broadcasting stations so that they cannot listen to the desired radio broadcast without difficulty because they are requested to make a channel selection on the basis of the broadcast time schedule shown in FIG. 1. Further, the manufacturers that make radio receivers for receiving overseas radio broadcasts must prepare similar broadcast time schedules for the convenience of those who buy and use the radio receivers.

OBJECTS AND SUMMARY OF THE INVENTION

Accordingly, it is an object of the present invention to provide an improved radio receiver that eliminates the defects encountered with the prior art.

More specifically, it is an object of the present invention to provide a radio receiver by which a listener can readily select a target broadcasting station without knowing the frequency of the broadcasting station at a particular broadcasting time.

It is another object of the present invention to provide a radio receiver that enables beginners or listeners in general to listen to a desired overseas radio broadcast with ease.

According to an aspect of the present invention, there is provided a radio receiver comprising: phase locked loop means for generating an oscillation signal; means responsive to the oscillation signal for receiving and frequency-converting a radio broadcast; a memory having a data table including broadcasting station identification data, broadcasting time data, and frequency data necessary for receiving a predetermined radio broadcast at a predetermined broadcasting time; a timer for generating time data; and a key for selecting a broadcasting station; wherein: in response to operation of the key, the selection of the broadcasting station and the time data are supplied to the data table as input data and corresponding frequency data is read out of the data table on the basis of the input data and supplied to the phase locked loop means, whereby a predetermined frequency indicated by the frequency data is selected.

In accordance with another aspect of the invention, there is provided a radio receiver comprising: phase locked loop means for generating an oscillation signal; means responsive to the oscillation signal for receiving and frequency-converting a radio broadcast; a memory having a data table including broadcasting station identification data, broadcasting time data, and frequency data necessary for receiving a predetermined radio broadcast at a predetermined broadcasting time; a random access emory for containing data indicating a broadcasting station; a timer for generating time data; and a first key and additional key means for selecting a broadcasting station; wherein: in response to operation of the first key, the selection of the broadcasting station and the time data are employed to extract corresponding frequency data from the data table, and the frequency data thus extracted is supplied to the phase locked loop means, whereby a predetermined frequency indicated by the frequency data is selected; and, in response to operation of the additional key means, the data indicating the broadcasting station is selectively written in or read from the random access memory, the data read from the random access memory and the time data are employed to extract corresponding frequency data from the data table, and the frequency data thus extracted is supplied to the phase locked loop means, whereby a predetermined frequency indicated by the frequency data is selected.

The foregoing and other objects, features and advantages of the present invention will be apparent in the following detailed description of the preferred embodiments thereof when read in conjunction with the accompanying drawings, in which the same reference numerals are used to identify the same or similar parts in the several views.

BRIEF DESCRIPTION OF THE DRAWINGS

FIG. 9 (formed of FIGS. 9A and 9B to permit the use of a suitably large scale) is a flowchart to which reference will be made in explaining the operation of the second embodiment.

DESCRIPTION OF THE PREFERRED EMBODIMENTS

The present invention will hereinafter be described with reference to the drawings.

Figure 2:
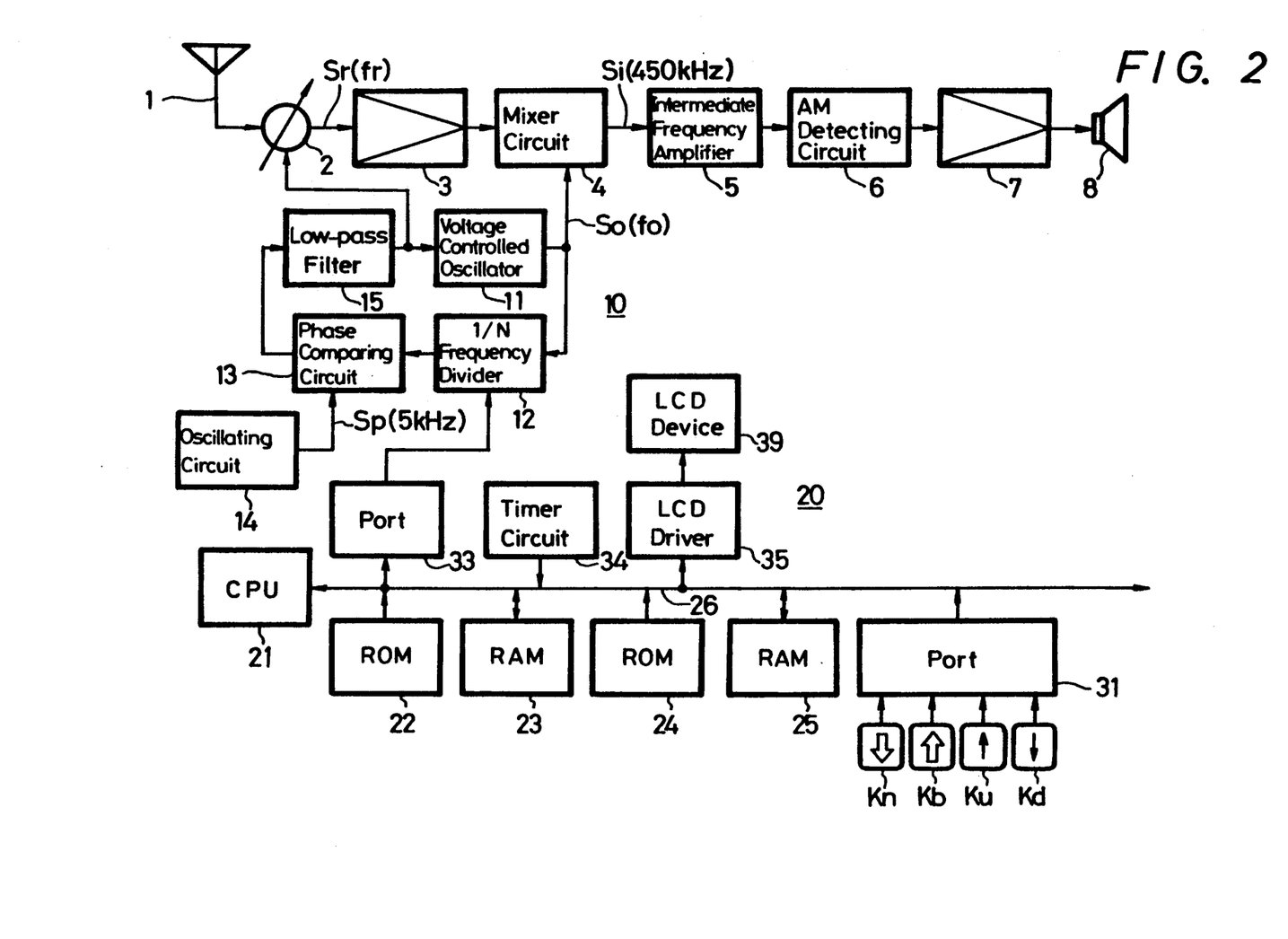
FIG. 2 is a block diagram showing a first embodiment of a radio receiver constructed in accordance with the present invention.

FIG. 2 shows the general or overall construction of the radio receiver according to a first embodiment of the present invention.

In FIG. 2, it will be seen that a broadcast signal is received at an antenna 1 and is fed to an antenna tuning circuit 2. The antenna tuning circuit 2 of the example is of an electronic tuning type and derives a desired AM broadcast signal Sr having a frequency fr.

This signal Sr is supplied through a high frequency amplifier 3 to a mixer circuit 4. A voltage-controlled oscillator (VCO) 11 derives an oscillation signal So having a frequency fo which is expressed by the following equation $$fo = fr + 450 \text{ (kHz)} \tag{1}$$

This signal So is supplied to the mixer circuit 4 as a local oscillation signal, whereby the signal Sr is converted to an intermediate frequency signal Si having a frequency of 450 kHz. This signal Si is supplied through an intermediate frequency amplifier 5 to an AM detecting circuit 6, from which there is derived an audio signal. This audio signal is supplied through a low frequency amplifier or an audio amplifier 7 to a speaker 8.

The VCO 11 and circuits 12, 13, 14 and 15 constitute a phase locked loop (PLL) circuit 10. More specifically, the signal So from the VCO 11 is supplied to a variable frequency dividing circuit 12 and is thereby frequency-divided by N. The frequency-divided signal is then supplied to the phase comparing circuit 13, and the reference oscillating circuit 14 produces a reference oscillation signal Sp having a reference frequency of 5 kHz which is also supplied to the phase comparing circuit 13. The phase comparing circuit 13 phase-compares the frequency-divided signal and the oscillation signal Sp, and the compared output therefrom is supplied through the low-pass filter 15 to the VCO 11 as its control voltage. The output from the low-pass filter 15 is supplied also to the mixer or tuning circuit 2 as a channel-selection voltage.

Accordingly, in the stationary state, the frequency of the frequency-divided signal from the frequency-dividing circuit 12 is equal to that of the oscillation signal So so that the frequency of the oscillation signal So is expressed by the following equation $$fo + 5 \text{ (kHz)} \times N \tag{2}$$

In that event, equation (1) is established.

Figure 3:
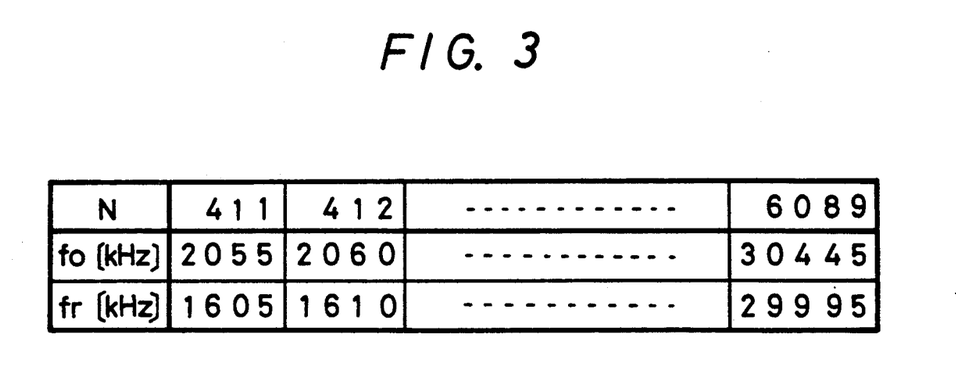
FIG. 3 is a schematic representation of a broadcasting frequency assignment, to which reference will be made in explaining the operation of the radio receiver shown FIG. 2.

Therefore, as shown on the first line of FIG. 3, if the frequency-dividing ratio N is changed by "1" each in a range of 411 to 6089, then the local oscillation frequency fo will be changed by an interval of 5 kHz in a frequency range of 2055 kHz to 30445 kHz as shown on the second line of FIG. 3. Thus, the receiving frequency fr is changed by an interval of 5 kHz in a frequency range of 1605 kHz to 29995 kHz in response to the frequency-dividing ratio N as shown on the third line of FIG. 3.

The frequency-dividing ratio N is set in the frequency dividing circuit 12 by a microcomputer 20 which is used to control the whole system. The microcomputer 20 may comprise an M-50932 produced by Mitsubishi Electric Corporation for the channel-selection system, and an M-34200 produced by Mitsubishi Electric Corporation for the timer system.

Figure 4:
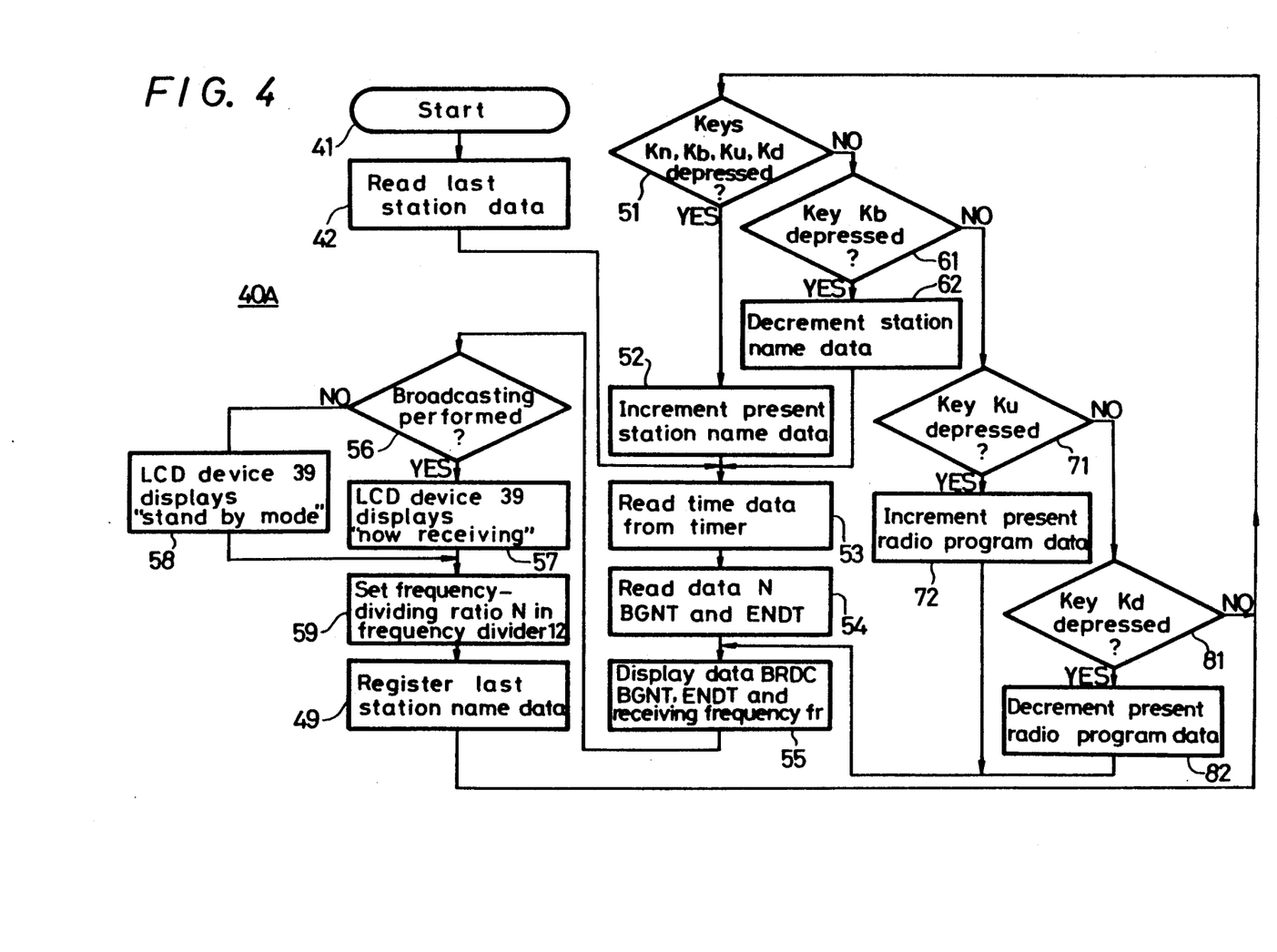
FIG. 4 is a flowchart of a program which is stored in a read only memory of the radio receiver of FIG. 2 and to which reference will be made in explaining the operation of the same.
Figure 5:
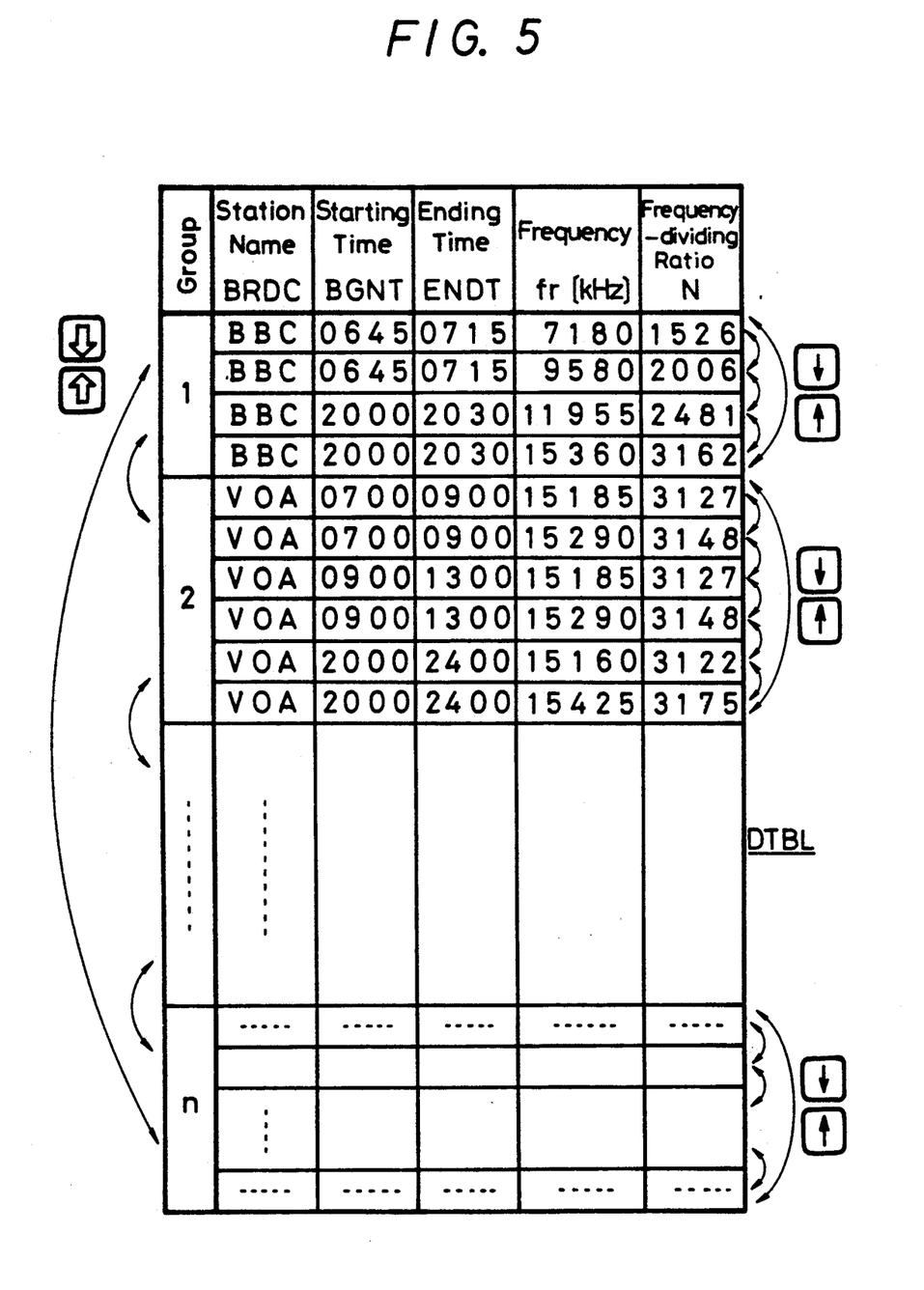
FIG. 5 is a schematic representation of a data table which is stored in a read only memory of the radio receiver of FIG. 2 and to which reference will be made in explaining the operation of the same.

More specifically, in the microcomputer 20, reference numeral 21 designates a central processing unit (CPU) of, for example, 4 bits, 22 a read only memory (ROM) that stores a program shown in FIG. 4, 23 a random access memory (RAM) used as a work area, 24 a read only memory (ROM) that stores a data table shown in FIG. 5, and 25 a nonvolatile RAM that stores "last-station" data (data indicating the name of a station that was being received when the power source of the radio receiver was last turned OFF). Further, in FIG. 2, reference numerals 31 and 33 designate ports, 34 a timer (timer circuit), and 35 a driver for driving a liquid crystal display (LCD) device 39. The LCD device 39 indicates the station name, receiving frequency fr and the like in a digital fashion. These circuits 22 to 25 and 31 to 35 are connected to the CPU 21 via a system bus line 26.

The data table DTBL written in the ROM 24 has the following contents, which will be described with reference to FIG. 5.

As FIG. 5 shows, data are classified to provide data corresponding to each broadcasting station. Also, for each group of broadcasting stations (British Broadcasting Corporation (BBC), Voice of America (VOA), etc.), predetermined numbers of sets of station name data BRDC, broadcast start time data BGNT, end time data ENDT thereof and frequency-dividing ratio N corresponding to frequency fr broadcast during the periods of time delimited by BGNT and ENDT are written in the data table DTBL. However, the frequency fr may not be directly written in the data table DTBL because the frequency-dividing ratio N is written therein as frequency data.

The port 31 (FIG. 2) is connected with two pairs of keys Kn, Kb; and Ku, Kd each of which is a non-lock type push switch. The keys Kn, Kb are channel-selection keys for selecting broadcasting stations, and the keys Ku, Kd are frequency keys for selecting the frequency fr (radio program) of the selected broadcasting station.

The RAM 25 is constructed as a nonvolatile memory, backed up by a battery, so that its contents are preserved when the radio receiver is turned OFF. The timer 34 always keeps track of the time regardless of the operating state of the radio receiver. Further, the LCD driver 35 is adapted to read data from a display address DSPA in the addresses of the RAM 23 and to convert the same into display data. This display data is supplied to the LCD device 39.

The apparatus described above receives the radio broadcasting program in accordance with a routine 40A of a flowchart forming FIG. 4.

In FIG. 4, after a power switch (not shown) is turned ON, the processing by the CPU 21 begins with step 41 of the routine 40A, and the routine proceeds to step 42. At step 42, the last-station data is read out of the RAM 25, i.e. station name data BRDC of the broadcasting station (BBC, VOA, etc.) which was selected just before the power switch was last turned OFF, is read out from the RAM 25. Then the routine proceeds to the next step 53, whereat time data TIME indicating the present time is generated from the timer 34.

At the next step 54, the data table DTBL is checked on the basis of station name data BRDC and time data TIME, and the appropriate frequency-dividing ratio N is obtained in accordance with the data BRDC and TIME. In this case, the frequency-dividing ratio N is obtained according to the following rule:

When the broadcasting schedule of the broadcasting station, indicated by station name data BRDC, is presented as, for example, shown in FIG. 1, if the time data TIME indicates a time t1 within the period T1, then a frequency-dividing ratio N will be obtained so as to receive one of the frequencies f1 and f2 broadcast during the period T1 including the time t1. For example, the frequency f1 may be selected. The selection of the frequency f2 will be described later. If on the other hand the time data TIME indicates a time t2 that is located between the periods T1 and T2, then a frequency-dividing ratio N will be obtained so as to receive the frequency f2 of the period T2, which is the first broadcasting period after the time t2, even though the time t2 is located nearer to the period T1 than it is to the period T2, as shown in FIG. 1. Further, if the time data TIME indicates a time t3 included in both the periods T2 and T3, then a frequency-dividing ratio N will be obtained so as to receive the frequency f3 of the one of the periods T2 and T3 whose ending time is the later.

At step 54, the frequency-dividing ratio N is obtained together with the time data BGNT and ENDT forming a pair with the frequency-dividing ratio N. The routine then proceeds to step 55.

Figures 6A, 6D:
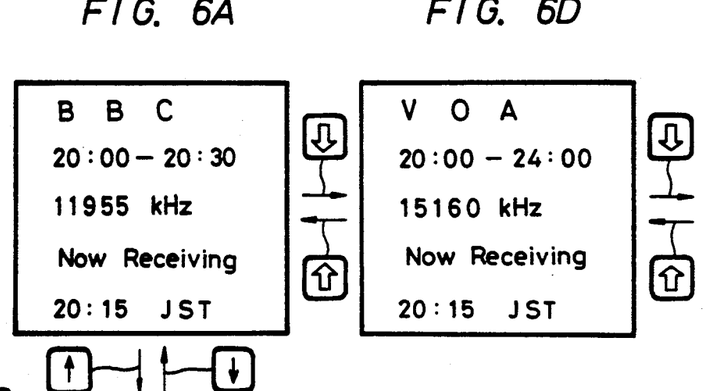
FIGS. 6A-6D are schematic representations to which reference will be made in explaining examples of displays made on a liquid crystal display device of the radio receiver of the present invention.

At step 55, a receiving frequency fr is calculated from the frequency-dividing ratio N by use of equations (1) and (2). Then the frequency fr, the time data BGNT, ENDT, and the station name data BRDC, each of which is obtained at step 54, are written in the display address DSPA of the RAM 23. Therefore, the LCD device 39 displays the station name BRDC, the broadcasting times BGNT, ENDT, and the receiving frequency fr on the basis of the data written in the RAM 23 in a digital fashion as shown in FIG. 6A. Simultaneously, the current time (e.g., 20:15 Japan standard time) is displayed on the LCD device 39 on the basis of the time data TIME of the timer 34.

More specifically, as shown in FIG. 6A, the last-station data is "BBC" and the current time is "20:15 JST," whereby the group of "BBC" is selected from the data table DTBL (FIG. 5) and third data (data on the third line), i.e. "BBC," "2000," "2030," and "2481," are derived from the data table DTBL. Then a receiving frequency "11955 kHz" (=fr) is calculated from these data, i.e. station name "BBC," broadcasting time "20:00–20:30" and data "2481" (=N), and is displayed on the LCD device 39 (FIG. 6A). Further, the current time "20:15 JST" counted by the timer 34 is also displayed on the LCD device 39.

Figure 6B:
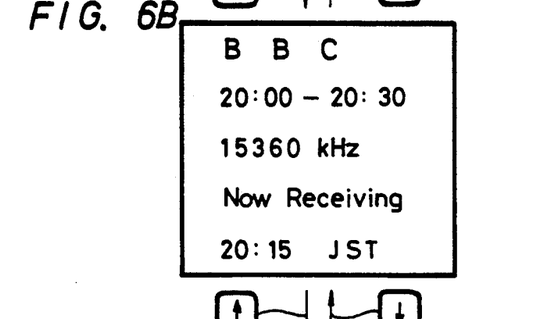
Figure 6C:
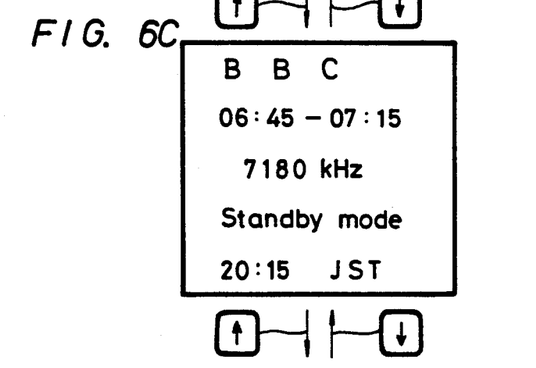

As FIG. 4 shows, the processing by the CPU 21 then proceeds from step 55 to the next decision step 56. At step 56, it is determined by the CPU 21 whether or not the broadcasting is being performed at the present time via the frequency fr selected at step 54. In other words, it is determined whether BGNT≦TIME≦ENDT (condition at times t1 and t3 of FIG. 1) is satisfied or whether TIME<BGNT or TIME>ENDT (condition at time t2 of FIG. 1) is satisfied. If a YES is obtained at step 56, then the routine proceeds from step 56 to step 57. At step 57, the LCD device 39 displays "now receiving" as shown in FIG. 6A. If a NO is supplied as an output at step 56, then the routine proceeds to step 58, whereat the LCD device 39 displays "standby mode" as shown in FIG. 6C.

The processing by the CPU 21 proceeds from step 57 or 58 to the next step 59, whereat the frequency-dividing ratio N obtained at step 54 is set in the frequency-dividing circuit 12. Therefore, from the time at which the step 59 is executed, the radio receiver of this embodiment is set in the channel selection state for selecting the broadcasting station and the frequency now displayed on the LCD device 39. If broadcasting is performed (at times t1, t3 and so on), it can be received. If on the other hand the broadcasting is not yet performed or the time is before the broadcasting (at time t2 and so on), the radio receiver is set in the standby mode awaiting the start of broadcasting.

Accordingly, when the power switch of the radio receiver is turned ON, the receiver is automatically tuned to the frequency of the current or next broadcast of the station previously selected When the broadcast commences, the listener will be able to listen to it. Further, the broadcasting station name and the like are displayed as shown, for example, in FIG. 6A.

The processing by the CPU 21 proceeds from step 59 to step 49, and in step 49, the station name BRDC of the broadcasting station now selected at step 49 is written in the RAM 25 as the last-station data.

The processing by the CPU 21 proceeds from step 49 to the next decision step 51. At step 51, it is determined by the CPU 21 whether or not any of the keys Kn, Kb; and Ku, Kd are depressed. If it is determined that they are not depressed, as represented by a NO at step 51, then steps 51, 61, 71 and 81 are repeated and the radio receiver of this embodiment waits for the key input by one of the keys Kn to Kd. During the period in which the radio receiver awaits such a key input, the radio receiver is continuously set in the receiving mode for receiving the broadcasting station and the frequency of that station selected at step 59, or the radio receiver is set in the standby mode awaiting the start of broadcasting.

When the radio receiver is set in the standby mode, the program cycles through steps 51, 61, 71 and 81, awaiting depression of one of the keys Kn, Kb, Ku, Kd. If the "next-station" key Kn is depressed, this is identified by a YES at step 51, and the routine proceeds from step 51 to step 52. At step 52, the station name data BRDC up to that time is incremented from the station name data of the corresponding group to the station name data of the next group so that the station name data BRDC of the broadcasting station, which was represented as "BBC" in FIG. 5, may be incremented to present "VOA" of the next group. If the station name BRDC of the broadcasting station up to that time is the station name data of the last group on the data table DTBL, then the station name data of the next group will become the station name of the first group, i.e. "BBC" in FIG. 5. In other words, the data table is in effect circular or endless.

Then the routine proceeds from step 52 to step 53. Accordingly, in steps 53 to 59, the current or next broadest frequency of the next broadcasting station is selected. For example, if the "next-station" key Kn is depressed under the condition that the "BBC" is received as shown in FIG. 6A, then the next station "VOA" will be selected and the frequency "15160 kHz" on which the broadcasting is performed at that time will be selected and received as shown in FIG. 6D.

Similarly, each time the "next-station" key Kn is depressed, the next broadcasting station is selected from the data table DTBL of FIG. 5, and the current or next broadcast frequency of that station is selected.

When the radio receiver is set in the standby mode awaiting a key input at steps 51, 61, 71 and 81 and the "preceding station" key Kb, for example, is depressed, the depression of the key Kb is identified at decision step 61. If a YES is obtained at step 61, then the routine proceeds to step 62. At step 62, the station name data BRDC is decremented from the station name data of the present group to the station name data of the preceding group so that the station name data "VOA" of the present group is changed to "BBC" of the preceding group as shown in FIG. 5. If the station name data BRDC indicates the station name data of the first group of the data table DTBL, then the station name data of the next group (i.e., after decrementing) will become the station name data of the last group of the data table. In other words, as indicated above, the data table is in effect circular or endless.

Then, the routine proceeds from step 62 to step 53. Accordingly, in steps 53 to 59, the current or next broadest frequency of the preceding broadcasting station in the data table of FIG. 5 is selected. For example, if the "preceding-station" key Kb is depressed under the condition that "VOA" is received as shown in FIG. 6D, then the preceding station "BBC" will be selected, and the frequency "11955 kHz" on which the broadcasting is performed at that time will be selected and received as shown in FIG. 6A.

Similarly, each time the "preceding-station" key Kb is depressed, the preceding broadcasting station is selected from the data table DTBL of FIG. 5, and the current or next broadcast frequency of that station is selected.

Further, when the radio receiver of this embodiment is set in the standby mode awaiting a key input at steps 51, 61, 71 and 81 and the "up" key Ku, for example, is depressed, the depression of the "up" key Ku is identified at decision step 71. Then the routine proceeds from step 71 to the next step 72. At step 72, if the broadcasting station and the frequency received up to that time are "BBC" and "11955 kHz" at "20:00-20:30" as shown in FIG. 6A, then the set of the next broadcasting times BGNT and ENDT and the frequency-dividing ratio N within the present broadcasting group up to that time is selected so that the data are changed to the data of the broadcasting station "BBC" and the frequency "15360 kHz" at "20:00-20:30" as shown in FIG. 6B. If the current set of data is the last set of the group of a particular broadcasting station, then the next set selected will be the first set of the same group, because the several groups in the data table are also arranged in a pattern that is in effect circular or endless.

Then the routine proceeds from step 72 to step 55. Therefore, in the steps 55 to 59, the broadcasting station is not changed, and only the receiving frequency fr is changed to the next receiving frequency of the same station. If broadcasting is then being performed at that frequency, then the broadcast will be received, while if broadcasting at that frequency is not then being performed but is only scheduled for a future time, then the radio receiver is set in the standby mode until such time as broadcasting at that frequency begins.

Similarly, each time the "up" key Ku is depressed, then the receiving frequency fr is incremented to the next frequency of that broadcasting station without changing the broadcasting station.

When the radio receiver is set in the standby mode awaiting a key input at steps 51, 61, 71 and 81 and the "down" key Kd, for example, is depressed, then the depression of the "down" key Kd will be identified at step 81, and the routine proceeds from step 81 to step 82. At step 82, if the broadcasting station and the frequency received up to that time are "BBC" and "15360 kHz" at "20:00-20:30" as shown in FIG. 6B, the set of the next broadcasting times BGNT, ENDT and the frequency-dividing ratio N within the present broadcasting station group up to that time is selected such that they are changed to the data of the broadcasting station "BBC" and the frequency "11955 kHz" at "20:00-20:30" shown in FIG. 6A. If the current set of data within one broadcasting group is the first set, then the next set selected will be the last set of the same group, because of the circular or endless nature of the several groups in the data table.

The routine proceeds from step 82 to step 55. Accordingly, in steps 55 to 59, the broadcasting station is not changed, and only the receiving frequency fr is changed to the preceding receiving frequency of the same station. If broadcasting is then being performed at that frequency, then the broadcast will be received by the radio receiver of this embodiment. If broadcasting at that frequency is not then being performed but is only scheduled for a future time, then the radio receiver of this embodiment will be set in the standby mode until such time as broadcasting at that frequency begins.

Similarly, each time the "down" key Kd is depressed, the broadcasting station is not changed, and the receiving frequency fr is decremented to the preceding frequency of the same broadcasting station.

Therefore, if the "up" key Ku or the "down" key Kd is depressed, when the same radio program is broadcast by two or more frequencies in the same time period, as in the case of the period T1 of FIG. 1, it is possible for the listener to select the frequency which provides the best reception. When different radio programs are broadcast at time t3, it is possible for the listener to select a preferred radio program.

As described above, according to the present invention, the data table DTBL shown in FIG. 5 and the timer 34 shown in FIG. 2 are provided, whereby when a particular broadcasting station is selected by either of the keys Kn and Kb, a frequency on which that station can be received then or as soon as the next broadcast begins is selected. Thus beginners and other listeners can listen to overseas radio broadcasts with ease.

After a particular broadcasting station is designated, any of the frequencies on which that station broadcasts can be selected by operating the keys Ku and Kd, thus making it possible to select the frequency that gives the best reception of the desired radio program.

Further, since the desired frequency or a radio program of the desired broadcasting station can be selected merely by operating the keys Kn, Kb, Ku and Kd, it is not necessary to prepare a users' manual setting out the broadcasting schedule shown in FIG. 1.

A radio receiver according to a second embodiment of the present invention will be explained next.

In the first embodiment, the desired frequency or program of the desired broadcasting station is selected by operating the keys Kn, Kb, Ku and Kd as described above. In the second embodiment, the next-station key Kn and the preceding-station key Kb shown in FIG. 2 are replaced with n lock-type station-name keys (n corresponds to the number of predetermined broadcasting station groups), and these n station name keys are given labels "BBC," "VOA" and the like. In this manner, the listener can directly select the desired broadcasting station.

Figure 7:
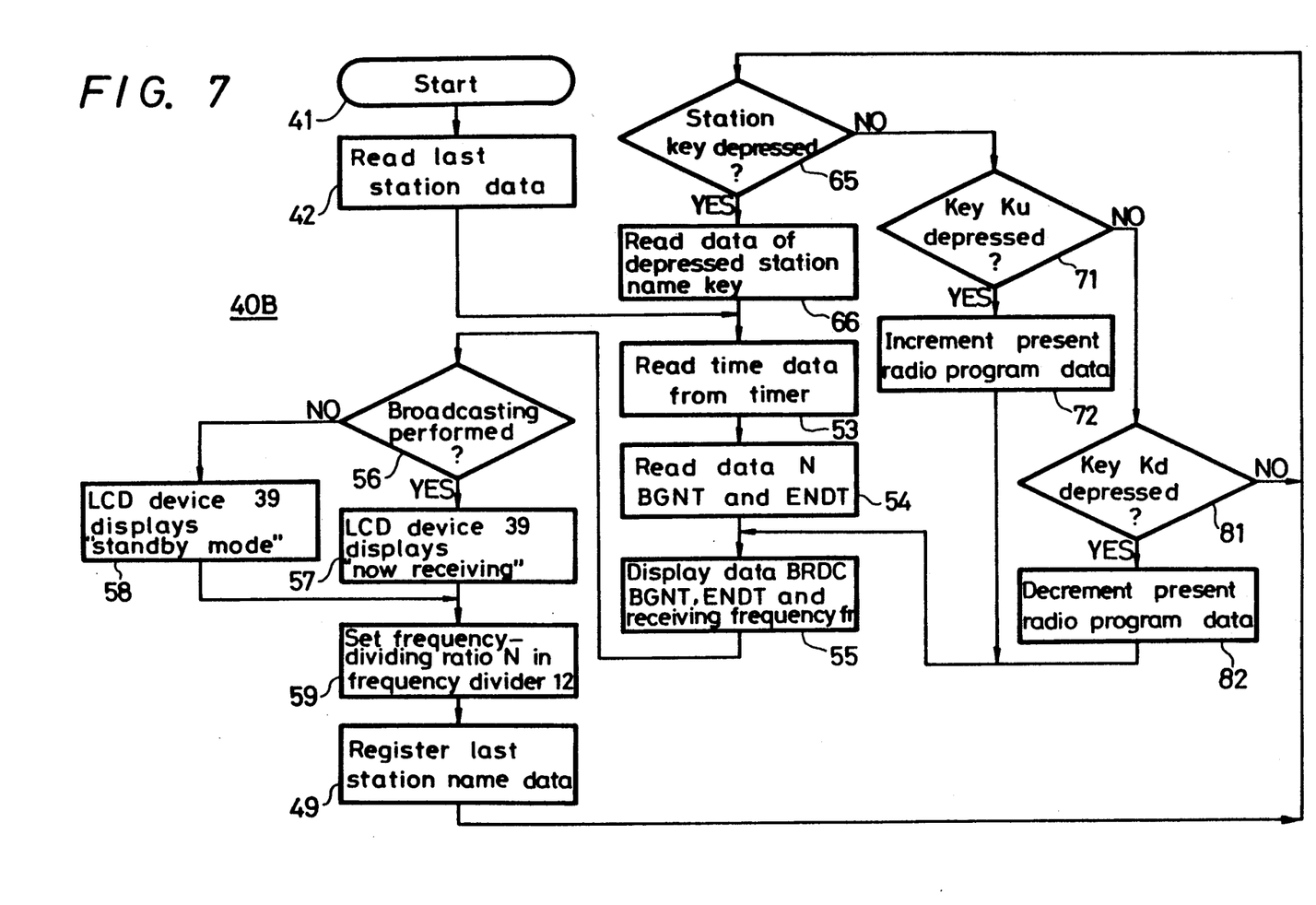
FIG. 7 is a flowchart to which reference will be made in explaining the operation of the present invention.

In the second embodiment, the broadcasting is received in accordance with a routine 40B shown in a flowchart forming FIG. 7. More specifically, the steps 51, 52, 61 and 62 of the flowchart forming FIG. 4 are replaced with steps 65 and 66 of FIG. 7. In FIG. 7, the CPU 21 determines at step 65 whether or not any of n station-name keys is depressed. If the CPU 21 determines that one of n station-name keys is depressed as represented by a YES at step 65, then the routine proceeds to step 66. At step 66, data of the depressed station-name key is read out. The other arrangements and steps in the routine 40B for receiving the radio broadcast in accordance with the second embodiment are the same as those of the first embodiment.

Figure 8:
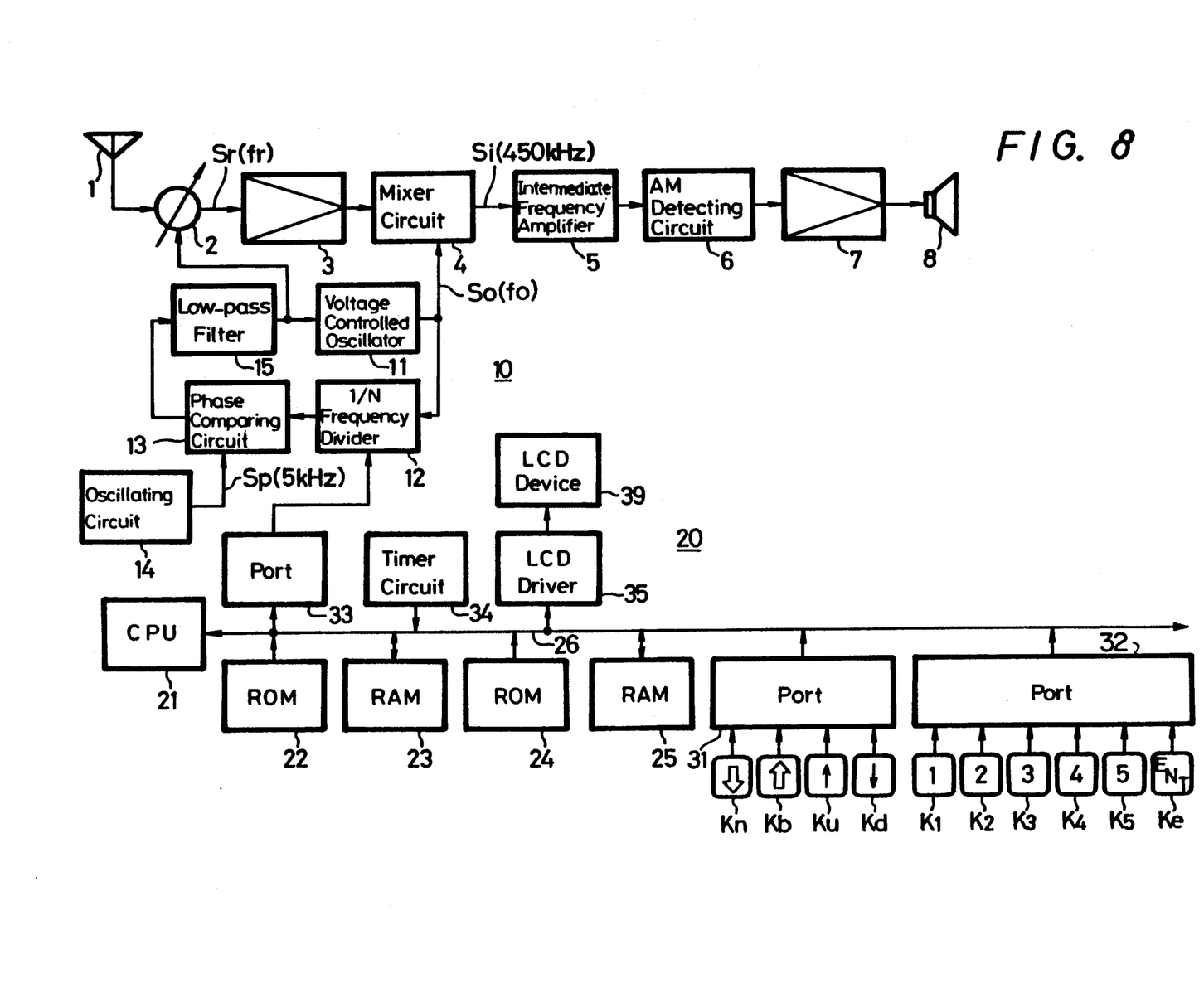
FIG. 8 is a block diagram showing a radio receiver according to a second embodiment of the present invention.

FIG. 8 is a block diagram of a radio receiver according to a third embodiment of the present invention. In FIG. 8, parts corresponding to those of FIG. 2 are marked with the same references and therefore need not be described in detail.

In the third embodiment, as FIG. 8 shows, five broadcasting station names are registered in keys K1 to K5, whereby the station selection can be directly performed by operating the keys K1 to K5.

Figure 9A:
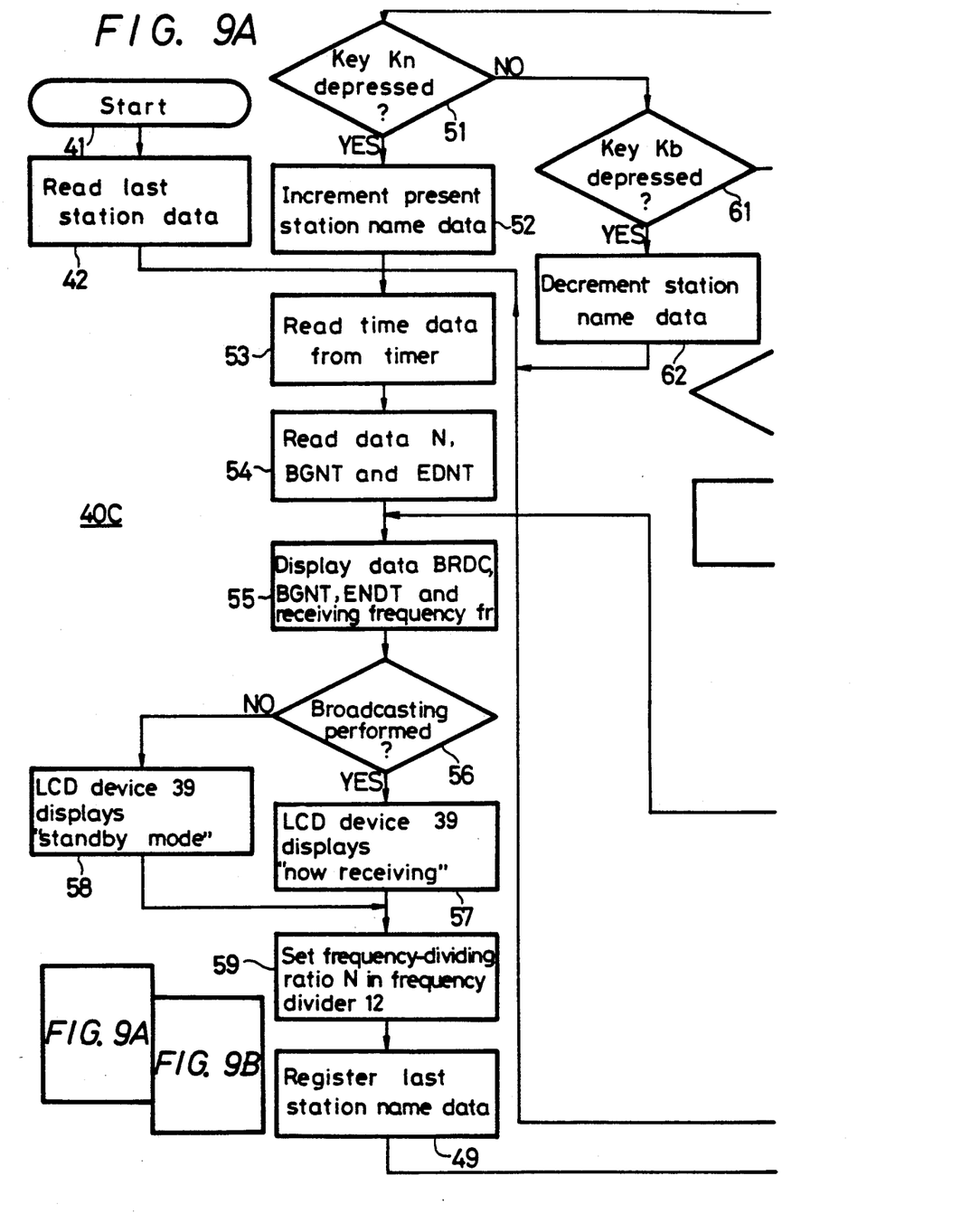
Figure 9B:
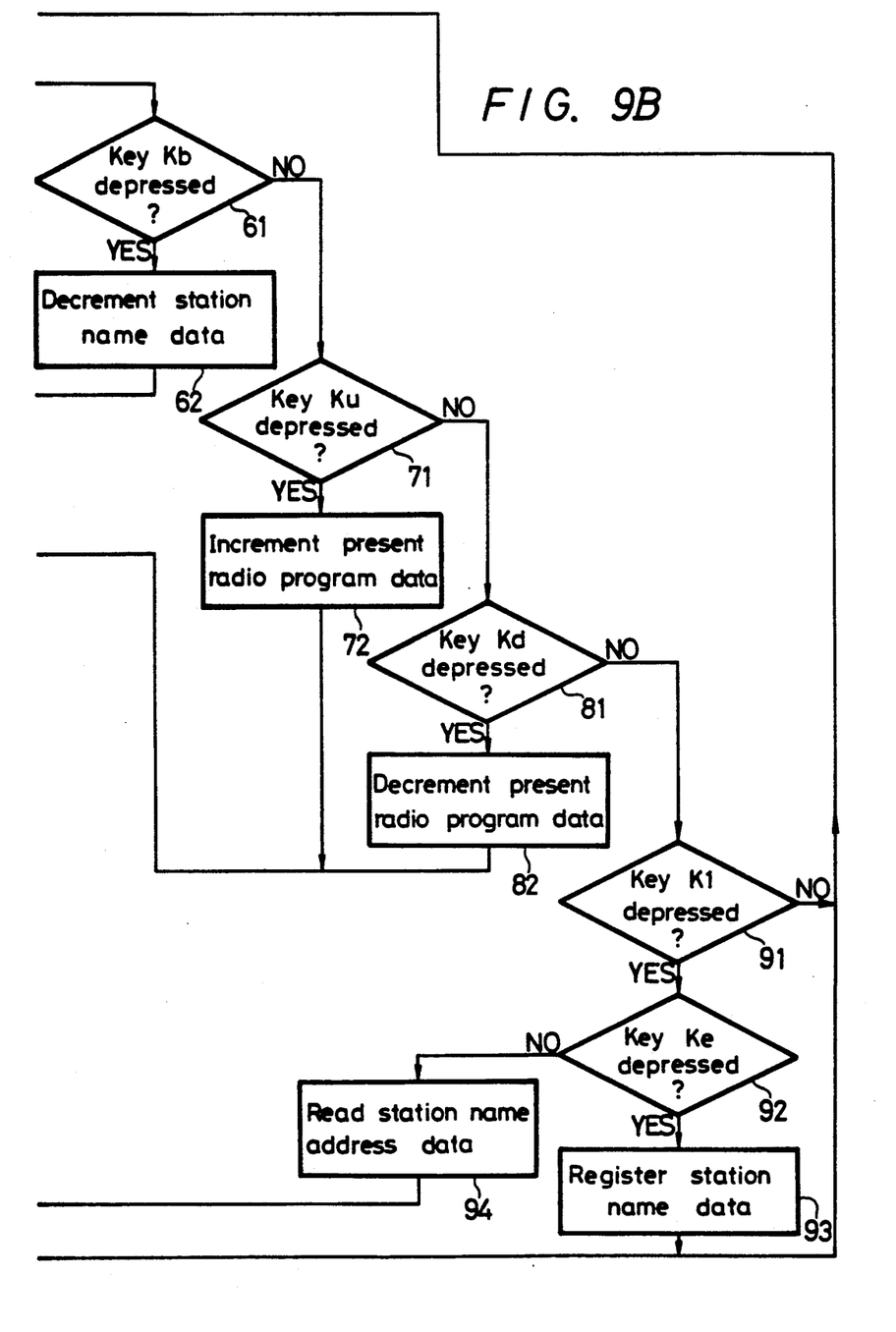

A routine 40C shown in a flowchart forming FIG. 9 is stored in the ROM 22. In the routine 40C, steps 41 to 82 are the same as those of the routine 40A of the flowchart of FIG. 4.

Further, the microcomputer 20 is provided with a port 32, and the station-name keys K1 to K5 and an "enter" key Ke are connected to the port 32. Each of these keys K1 to K5 and Ke is a push switch of nonlocking type. The RAM 25 includes address areas A1 to A5 in which there are stored data corresponding to the keys K1 to K5 in addition to the last-station data.

During a period in which the radio receiver receives a radio broadcast or is in a standby mode, steps 51, 61, 71, 81 and 91 are repeated and the receiver awaits a key input.

When, for example, "BBC" (regardless of frequency fr) is received, if any of the keys K1 to K5 is depressed, or if, for example, the key K1 and the key Ke are depressed at the same time, then the depression of the key K1 is identified at decision step 91, and the routine proceeds to the next decision step 92. At step 92, it is determined by the microcomputer 21 whether or not the key Ke is depressed together with the depression of the key K1. If both keys are depressed, then the routine proceeds to step 93. At step 93, the station name "BBC" is written in the RAM 25 at its address area A1 assigned to the key K1, because the radio receiver of this embodiment is now receiving the station-name data BRDC of the broadcasting station, viz. "BBC." The routine then returns to step 51.

If any one of the station-name keys K1 to K5 and the enter key Ke are simultaneously depressed upon receiving the desired broadcast, then the station name data BRDC of the broadcasting station received will be registered in response to the station-name key depressed.

If it is determined that the enter key Ke is not depressed together with the depression of the key K1 at step 92, then the routine proceeds to step 94. At step 94, the station-name address BRDC is read out of the RAM 25 at one address area corresponding to the depressed station-name key in the address areas A1 to A5. The routine then proceeds to step 53. Accordingly, if any of the station-name keys K1 to K5 is depressed in the key input waiting mode, the station name registered by the depressed key is selected, and the frequency of the present broadcast or the frequency of the next broadcast will be selected and that broadcast can be received.

Therefore, by means of the radio receiver of this embodiment, it becomes possible to listen to a radio program of a broadcasting station with which the listener is familiar by operating the keys K1 to K5 without remembering the broadcasting frequencies and broadcasting times thereof.

In the first, second and third embodiments, when station selection is performed at time t3, the frequency f3 whose ending time is later can be received. According to a further embodiment of the present invention, it is possible to receive the frequency f2 whose starting time is earlier.

In still another embodiment of the present invention, the status of the power switch is monitored by the microcomputer 20, which is always powered, and only the power supply of the receiving system is turned ON and OFF on the basis of the monitored result. Alternatively, when the power supply switch is turned OFF manually, the power supply of the microcomputer 20 is also turned OFF, and the microcomputer 20 is set in the sleep mode (power-down mode). Then, when the power supply switch is turned ON, the microcomputer 20 is restored from the sleep mode to the normal operating mode, whereby the power supply of the receiving system is turned ON, and the routines 40A, 40B and/or 40C can be executed.

The timer 34 can be any accurate, conventional timer such as a quartz crystal timer and can even be realized by software.

In the data table DTBL, the end time ENDT may be replaced with the broadcasting period. Further, the ROM 24 may include a data table in which station name data BRDC of the broadcasting stations and the code number of each broadcasting station are stored in such a way that "BBC" is represented as "1," "VOA" is represented as "2," and so on. Furthermore, the station-name data BRDC of the data table DTBL may be employed as the code number. In addition, the ROM 24 may be replaced with a RAM and may be formed of a nonvolatile memory by backing up the same with a battery as in the case of the RAM 25.

According to the present invention, as set out above, there are provided the data table DTBL shown in FIG. 5 and the timer 34, whereby, when the broadcasting station is selected by the keys Kn and Kb, one of the broadcasts of the broadcasting station is selected. Specifically, the broadcast on the frequency that can be received at that time or the broadcast on the frequency that will be received during the next broadcast period is selected. Thus, beginners and ordinary listeners can listen to overseas radio broadcasts with ease.

After the broadcasting station is designated, one of the frequencies of the broadcasts made by the designated broadcasting station can be selected by the keys Ku and Kd, whereby the frequency for best reception or the preferred radio program can be selected.

Furthermore, since the desired frequency or the radio broadcast of the desired broadcasting station can be selected by operating the keys Kn, Kb, Ku and Kd, it is not necessary to prepare the broadcasting schedule table shown in FIG. 1.

The preferred embodiments of the invention are described above in detail with reference to the accompanying drawings. The present invention is of course not limited to those precise embodiments; many changes and modifications can be effected therein by one skilled in the art without departing from the spirit and scope of the invention as defined in the appended claims.

We claim:

1. A radio receiver comprising:
phase locked loop means for generating an output oscillation signal;
means responsive to the output oscillation signal for receiving and frequency-converting a radio broadcast;
a memory having a data table including broadcasting station name identification data for a plurality of broadcasting stations, wherein each of said stations broadcasts at different time periods over different respective frequencies, and said data table further includes predetermined broadcasting time data corresponding to each of said different time periods, and predetermined different frequency data corresponding to respective ones of said different time periods for receiving a predetermined radio broadcast at a predetermined broadcasting time;
a timer for generating current time data;
key means for selecting one of said plurality of broadcasting stations by name; and
processing means connected to said memory, to said timer, and to said key means, so that in response to operation of said key means selecting a broadcasting station name and said current time data said processing means selects from said data table frequency data corresponding to said selected broadcasting station name at said current time and supplies said frequency data to said phase locked loop means, whereby based on said selection of said broadcasting station by name, the radio receiver is automatically tuned to a one of said different frequencies at which said selected station broadcasts at said current time.

2. A radio receiver according to claim 1 further comprising display means for displaying the current time data, the name of the selected broadcasting station, beginning and ending times of a current or subsequent broadcast of said selected broadcasting station, said predetermined frequency, and an indication whether said radio receiver is now receiving said radio broadcast or is on standby to receive said radio broadcast.

3. A radio receiver according to claim 1 wherein said means for receiving and frequency-converting a broadcast signal includes a channel selection tuner and said phase locked loop means comprises a voltage-controlled oscillator for producing said output oscillation signal, a frequency divider connected to said processing means for dividing said output oscillation signal by N to produce a 1/N output, where N is one of a plurality of predetermined numbers corresponding to a respective one of said different frequencies in said data table, a reference oscillation circuit for producing a reference oscillation signal, a phase comparing circuit responsive to the 1/N output and the reference oscillation signal for producing a comparison signal, and a low-pass filter responsive to the comparison signal for producing a voltage signal, said voltage-controlled oscillator adjusting the frequency of said output oscillation signal in response to said voltage signal and said channel selection tuner selecting a channel in response to said voltage signal.

4. A radio receiver according to claim 3 wherein said frequency data is stored in said memory as a function of N, further comprising circuit means responsive to said memory and connected to said frequency divider for communicating a value of N to said frequency divider selected in accordance with said broadcasting station identification data and said broadcasting time data, whereby said 1/N output is adjusted in accordance with said broadcasting station identification data and said broadcasting time data.

5. A radio receiver comprising:
phase locked loop means for generating an output oscillation signal;
means responsive to the output oscillation signal for receiving and frequency-converting a radio broadcast;
a memory having a data table including broadcasting station name identification data for a plurality of broadcasting stations, wherein each of said stations broadcasts at a group of different time periods over different respective frequencies, and said data able further includes predetermined broadcasting time data corresponding to each of said programs, and predetermined frequency data corresponding to said different time periods for receiving a predetermined radio broadcast at a predetermined broadcasting time period;
a random access memory for containing data identifying a broadcasting station;
a timer for generating current time data;
a first key means for selecting one of said plurality of broadcasting stations by name and additional key means for selecting a broadcasting station; wherein; and
processing means connected to said phase-locked loop, to said memory, to said random access memory, and to said timer, so that in response to operation of said first key means selecting a broadcasting station name and said current time data said processing means reads out frequency data corresponding to said selected broadcasting station from said data table, the frequency data being supplied to said phase locked loop means, whereby based on said selection of said broadcasting station by name, the radio receiver is automatically tuned to a one of said group of different frequencies at which said selected station broadcasts at said current time, and in response to operation of said additional key means, the data identifying said broadcasting station is read from said random access memory, the data read from said random access memory and said current time data are employed to extract frequency data corresponding to said identified broadcasting station from said data table, and the frequency data thus extracted is supplied to said phase locked loop means, whereby a predetermined frequency at which said identified station broadcasts at said current time is selected.

6. A radio receiver according to claim 5 wherein said additional key means comprises a station key and an enter key, said station key and said enter key being employed together to write said data indicating said broadcasting station in said random access memory and said station key being thereafter employed to read said data indicating said broadcasting station from said random access memory.

7. A radio receiver according to claim 5 further comprising display means for displaying the current time data, the name of the selected broadcasting station, beginning and ending times of a current or subsequent broadcast of said selected broadcasting station, said predetermined frequency, and an indication whether said radio receiver is now receiving said radio broadcast or is on standby to receive said radio broadcast.

8. A radio receiver according to claim 5 wherein said means for receiving and frequency-converting a broadcast signal includes a channel selection tuner and said phase locked loop means comprises a voltage-controlled oscillator for producing said output oscillation signal, a frequency divider connected to said processing means for dividing said output oscillation signal by N to produce a 1/N output, where N is one of a plurality of predetermined numbers corresponding to a respective one of said group of different frequencies in said data table, a reference oscillation circuit for producing a reference oscillation signal, a phase comparing circuit responsive to the 1/N output and the reference oscillation signal for producing a comparison signal, and a low-pass filter responsive to the comparison signal for producing a voltage signal, said voltage-controlled oscillator adjusting the frequency of said output oscillation signal in response to said voltage signal and said channel selection tuner selecting a channel in response to said voltage signal.

9. A radio receiver according to claim 8 wherein said frequency data is stored in said memory as a function of N, further comprising circuit means responsive to said memory and connected to said frequency divider for communicating a value of N to said frequency divider selected in accordance with said broadcasting station identification data and said broadcasting time data, whereby said 1/N output is adjusted in accordance with said broadcasting station identification data and said broadcasting time data.

* * * * *

UNITED STATES PATENT AND TRADEMARK OFFICE
CERTIFICATE OF CORRECTION

PATENT NO. : 5,101,508
DATED : March 31, 1992
INVENTOR(S) : Owaki

It is certified that error appears in the above-identified patent and that said Letters Patent is hereby corrected as shown below:

```
On the title page, item [56] References Cited:
In references cited, Patent No. 4,626,909, change
   "Ohiki" to --Oniki--
     Patent No. 4,914,517, change "2/1990" to  -4/1990-
In other publications, change "56-8790" to  -56-87940-

In the Claims:

Col. 11, line 46, after "data" insert--,thereby--
         line 49, delete "at said current time"
         line 55, change "said" to --the--
Col. 12, line 46, delete "a"
         line 54, after "data" insert --,thereby--
         line 62, change "said" to-the--
Col. 13, line 5, change "said" to --the--
```

Signed and Sealed this

Seventeenth Day of May, 1994

*Attest:*

BRUCE LEHMAN

*Attesting Officer*   *Commissioner of Patents and Trademarks*